United States Patent
Willcox et al.

(10) Patent No.: US 12,255,583 B2
(45) Date of Patent: Mar. 18, 2025

(54) TEMPERATURE COMPENSATING ADJUSTABLE ULTRAVIOLET LAMP DRIVER CIRCUIT AND PHOTOIONIZATION DETECTOR EMPLOYING THE DRIVER CIRCUIT

(71) Applicant: MOCON, INC., Minneapolis, MN (US)

(72) Inventors: Charles Willcox, Hopkins, MN (US); David Jennings, Edina, MN (US); Christopher Fields, Coon Rapids, MN (US)

(*) Notice: Subject to any disclaimer, the term of this patent is extended or adjusted under 35 U.S.C. 154(b) by 203 days.

(21) Appl. No.: 18/187,767

(22) Filed: Mar. 22, 2023

(65) Prior Publication Data

US 2024/0322754 A1 Sep. 26, 2024

(51) Int. Cl.
*H03B 5/04* (2006.01)
*F21V 23/00* (2015.01)
*F21Y 111/00* (2016.01)

(52) U.S. Cl.
CPC ............ *H03B 5/04* (2013.01); *F21V 23/003* (2013.01); *F21Y 2111/00* (2013.01); *H03B 2200/0002* (2013.01)

(58) Field of Classification Search
CPC ............ H03B 5/04; H03B 2200/0002; F21Y 2111/00; H05B 41/14; G01N 21/33; H02M 1/36; H02M 7/53832
See application file for complete search history.

(56) References Cited

U.S. PATENT DOCUMENTS

2006/0082329 A1   4/2006   Chang
2012/0319588 A1*  12/2012  Sid ............... H05B 41/2855
                                                315/129

FOREIGN PATENT DOCUMENTS

CN   112399660 A   2/2021
EP   1122986 B1   6/2003

\* cited by examiner

*Primary Examiner* — Jeffrey M Shin
(74) *Attorney, Agent, or Firm* — Sherrill Law Offices, PLLC

(57) ABSTRACT

A photoionization detector sensor equipped with a temperature compensating and output adjustable ultraviolet lamp driver for supplying an alternating current signal to the ultraviolet lamp effective to light the ultraviolet lamp with direct current supplied from both a first variable voltage supply circuit and a second temperature sensitive fixed voltage supply circuit, and method of standardizing output of the photoionization detector sensor by adjusting the voltage supplied to the driver by the first variable voltage supply circuit so that future reported values will more closely approximate actual values.

10 Claims, 3 Drawing Sheets

TEMPERATURE COMPENSATING ADJUSTABLE ULTRAVIOLET LAMP DRIVER CIRCUIT AND PHOTOIONIZATION DETECTOR EMPLOYING THE DRIVER CIRCUIT

BACKGROUND

Photoionization detector (PID) sensors break molecules, typically volatile organic molecules, into positively charged ions and free electrons using high-energy ultraviolet (UV) radiation emitted by a UV lamp. As target analyte enters the detector, it is bombarded by high-energy UV photons. The target analyte absorbs the UV light, resulting in ejection of electrons and the formation of positively charged ions. The positively charged ions are sensed by an anode/cathode arrangement in the detector and produce an electric current whose amplitude is proportional to the positively charged ions produced (i.e., the greater the concentration of target analyte in the sample entering the detector the more positively charged ions produced resulting in a greater current). The current is amplified, displayed on an ammeter, or converted via a look-up table to a concentration of target molecules and digitally displayed.

The electronics used to light the UV lamp require a high voltage alternating current (AC) signal.

A common approach to providing the high voltage AC signal is to use an oscillator that drives the primary side of a step-up transformer. A typical circuit used for this purpose is a Baxandall oscillator, as generally depicted in FIG. 1. The Baxandall oscillator circuit is comprised of a push-pull driver comprised of two transistors (Q1 and Q2) feeding the primary side of a transformer T1 with direct current (DC) biased through a resistor $R_b$ from a circuit supply voltage $V_{in}$. A feedback signal from the primary side of the transformer T1 is provided to keep the transistors Q1 and Q2 operating out of phase.

Because output can vary from lamp to lamp, it is desirable to compensate for the variability by controlling the magnitude of the lamp drive by varying the circuit's input voltage in some manner. Often, a pulse width modulation (PWM) approach is used to control the average power to the lamp. Unfortunately, constant interruption of the electricity supplied to the circuit is associated with unwanted voltage and current spikes that produce excessive electrical noise known to be detrimental to highly sensitive devices such as PID sensors.

An alternative to PWM control is to vary the applied voltage to the Baxandall oscillator. This can efficiently be achieved using a variable output switching regulator. Unfortunately, use of a variable output switching regulator requires a low resistance bias resistor $R_b$ to maintain good start-up operation in both cold temperature and low drive voltage situations. Specifically, at cold temperatures, the transistor gain drops coupled with an increase in the transistor's base-emitter voltage, lowering the circuit's DC bias current and consequently its gain, which in turn reduces the circuit's ability to reliably ignite and start oscillating.

Setting of the bias resistor $R_b$ to a low resistance value causes excessive current draw when the circuit is driven at high temperatures where low resistance is not required, and when high operating drive voltages are supplied.

Accordingly, a need exists for a UV lamp drive circuit that is output adjustable via a variable input drive voltage with efficient power consumption over a wide temperature range while also maintaining good cold start performance without excessive electrical noise generation.

SUMMARY OF THE INVENTION

A first aspect of the invention is a temperature compensating and output adjustable ultraviolet lamp driver for supplying an alternating current signal to the ultraviolet lamp effective to light the ultraviolet lamp. The driver comprises an oscillator driving a primary side of a transformer. The oscillator includes a pair of transistors configured to operate out-of-phase feeding the primary side of the transformer with (i) direct current from a first variable voltage supply circuit, and (ii) direct current from a second fixed voltage supply circuit. The direct current from the second fixed voltage supply circuit is biased through a series of a positive temperature coefficient resistor and a primary bias resistor prior to reaching the transistors.

A second aspect of the invention is a photoionization detector sensor equipped with a driver in accordance with the first aspect of the invention. The photoionization detector sensor includes (i) an ultraviolet lamp operable for ionizing a target analyte within a sample, (ii) ignition electrodes for generating target analyte ionizing ultraviolet radiation within the lamp, (iii) sensing electrodes for detecting the presence of ionized target analyte within the sample and generating a current signal proportional to the concentration of target analyte within the sample, and (iv) a driver in accordance with claim 1 in electrical communication with the ignition electrodes.

The photoionization detector sensor can include a housing defining a sample retention chamber operable for holding the sample, the ultraviolet lamp operable for ionizing target analyte within the sample held within the retention chamber, and the electrodes operable for detecting the presence of ionized target analyte within the sample retention chamber.

A third aspect of the invention is a method of standardizing the output of the photoionization detector sensor in accordance with the second aspect so that reported values of target analyte concentration in a target analyte containing test sample will more closely approximate actual values of target analyte concentration in the target analyte containing test sample. The method involves the steps of (A) activating the photoionization detector sensor to detect target analyte in a standardizing sample to create an electrical signal having a test value, wherein the standardizing sample has a known concentration of the target analyte and is expected to generate an electrical signal of known anticipated value, (B) comparing the test value and the anticipated value, and (C) standardizing output of the photoionization detector sensor by adjusting the voltage supplied to the driver by the first variable voltage supply circuit so that future reported values will more closely approximate actual values.

DETAILED DESCRIPTION OF A PREFERRED EMBODIMENT

| Nomenclature Table | |
| --- | --- |
| REF. NO. | DESCRIPTION |
| 100 | Photoionization Detector Sensor |
| 110 | Housing |
| 119 | Sample Retention Chamber |
| $119_1$ | Sample Intake Port |
| $119_2$ | Sample Venting Port |
| 120 | UV Lamp |
| 121 | First Ignition Electrode |
| 122 | Second Ignition Electrode |
| 130 | Sensing Electrodes |
| $130_1$ | First Sensing Electrode or Anode |
| $130_2$ | Second Sensing Electrode or Cathode |
| 140 | Amplifier |
| 150 | Processor |
| 200 | Driver for UV Lamp |
| A | Target Analyte |
| C | Capacitor |
| L | Inductor |
| $Q_1$ | First Transistor |
| $Q_2$ | Second Transistor |
| $R_b$ | Primary Bias Resistor |
| $R_t$ | Positive Temperature Coefficient Resistor |
| $S_1$ | Current Signal from Sensing Electrodes |
| $S_2$ | Signal from Amplifier |
| $T_1$ | First Transformer |
| $V_b$ | Separate Supply Voltage |
| $V_{in}$ | Primary Circuit Supply Voltage |

Construction

Figure 3:
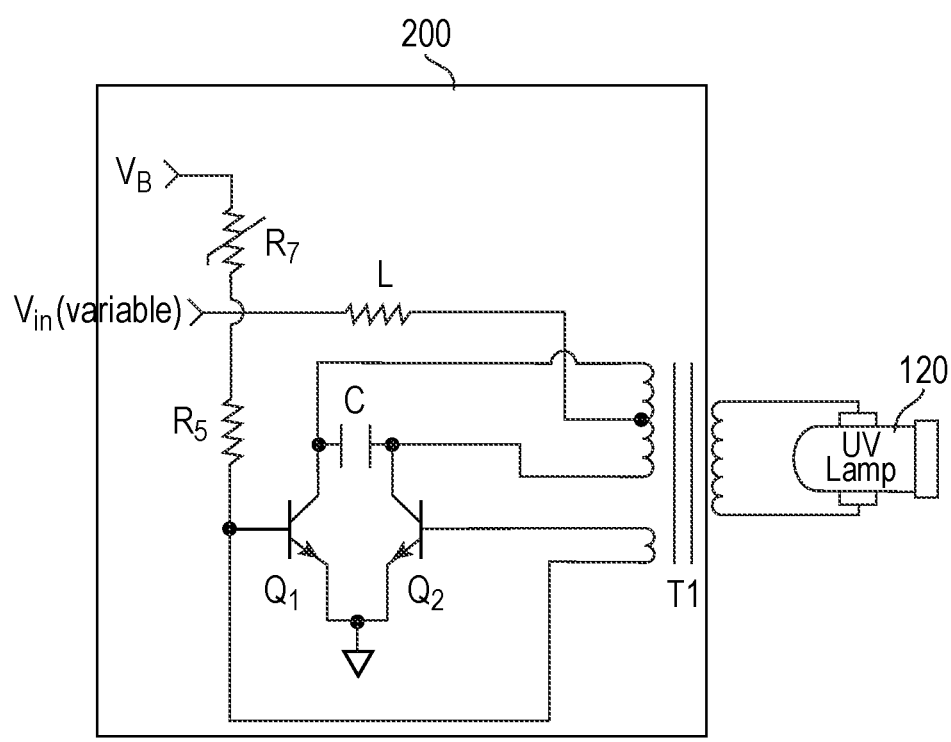
FIG. 3 is a circuit diagram of one embodiment of an UV lamp driver in accordance with the invention supplying an AC signal to an UV lamp.

Referring to FIG. 3, a first aspect of the invention is a temperature compensating and output adjustable ultraviolet lamp driver 200 for supplying an alternating current signal to the ultraviolet lamp 120 effective to light the ultraviolet lamp 120. Still referring to FIG. 3, a second aspect of the invention is a photoionization detector sensor 100 equipped with a lamp driver 200 in accordance with the first aspect of the invention.

Figure 1:
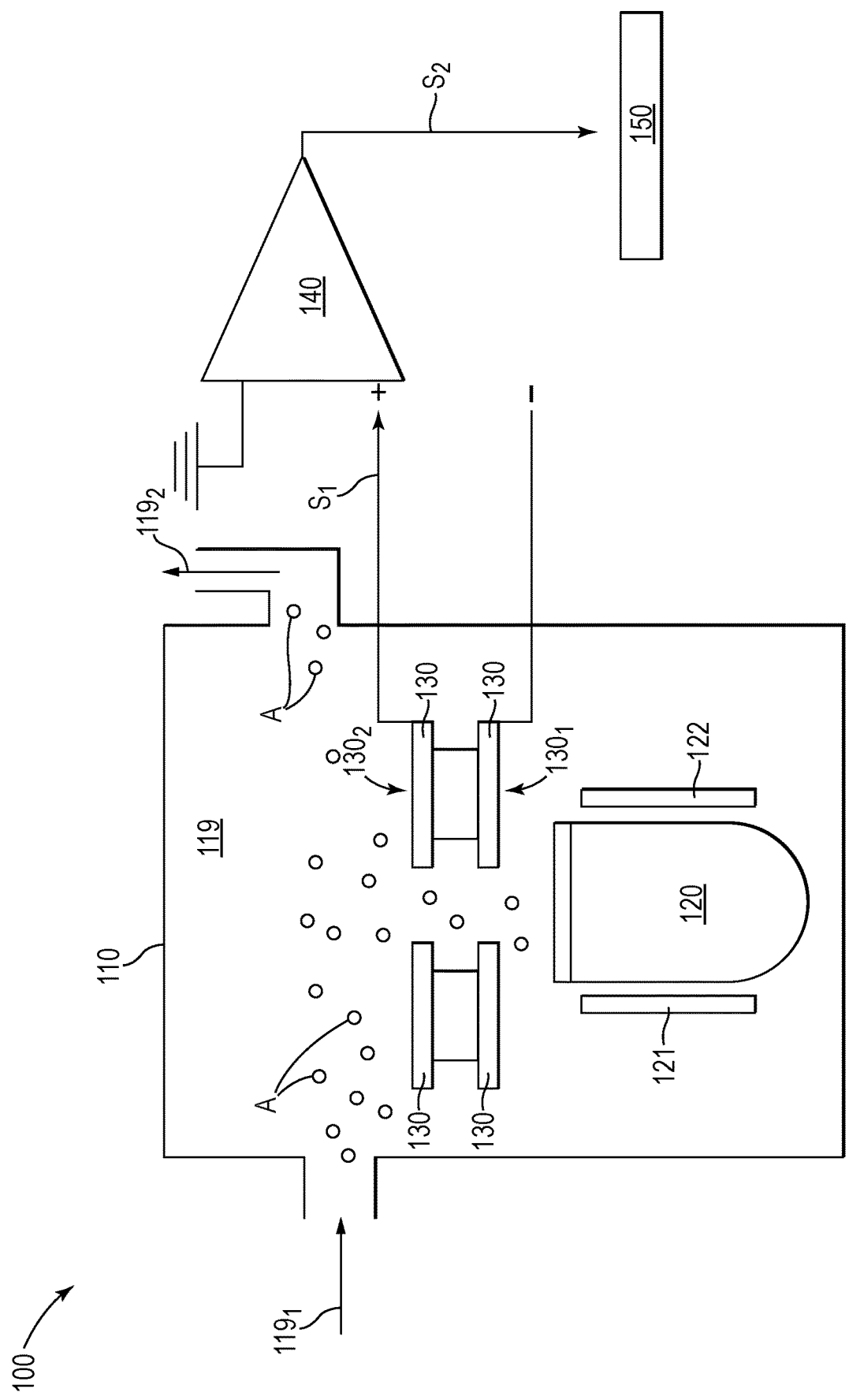
FIG. 1 is a schematic view of one embodiment of a typical PID sensor.

Referring to FIG. 1, photoionization detector sensors 100 have an ultraviolet (UV) lamp 120 for ionizing target analyte A within a sample, a pair of sensing electrodes 130 (i.e., an anode $130_1$ and a cathode $130_2$) for detecting the ions and generating a first electrical current signal $S_1$ proportional to the concentration of target analyte A within the sample, and an amplifier 140 in electrical communication with the electrodes 130 for receiving the generated first electrical current signal $S_1$ and amplifying and converting the first electrical current signal $S_1$ to a second voltage electrical signal $S_2$. These components are generally retained within a housing 110 that defines a sample retention chamber 119 positioned to receive UV radiation emitted by the UV lamp 120 upon excitation of the lamp 120 and having a sample intake port $119_1$ and optionally a sample venting port $119_2$.

Photoionization detector sensors 100 are employed in instruments that typically include a processor 150 for receiving the amplified electronic signal $S_2$, converting the value of the amplified electronic signal $S_2$ to a concentration of target analyte A in the sample based upon an algorithm or a lookup table, and displaying or otherwise reporting the concentration.

Figure 2:
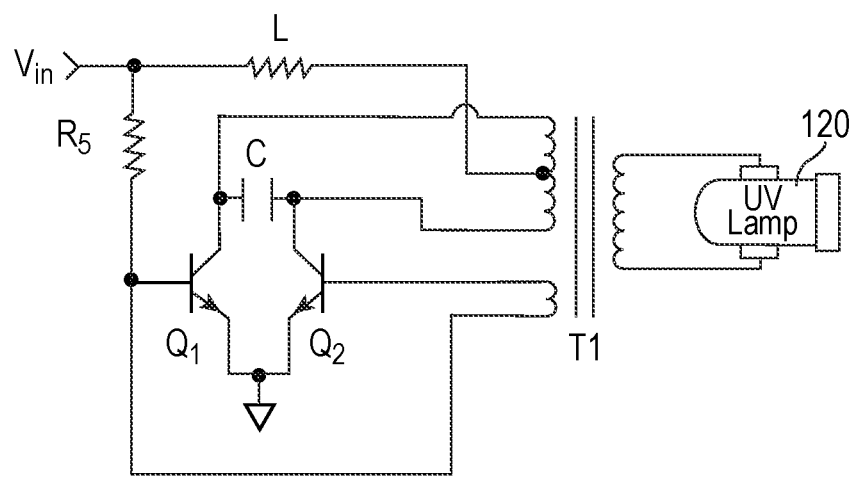
FIG. 2 is a circuit diagram of an exemplary prior art Baxandall oscillator supplying an AC signal to an UV lamp.

Referring to FIGS. 1 and 2, an alternating current signal is commonly supplied to a pair of ignition electrodes 121 and 122 positioned on opposite sides of an ultraviolet lamp 120 by an oscillator driving a primary side of a transformer $T_1$ wherein the oscillator includes a pair of transistors $Q_1$ and $Q_2$ configured to operate out-of-phase feeding the primary side of the transformer $T_1$. A common oscillator is a Baxandall oscillator such as depicted in FIG. 2. The Baxandall oscillator includes a circuit supply voltage $V_{in}$ biased via a biasing resistor $R_b$ prior to reaching the pair of transistors $Q_1$ and $Q_2$ with a feedback loop provided to keep the pair of transistors $Q_1$ and $Q_2$ operating out-of-phase. The Baxandall oscillator further includes an inductor L and a capacitor C as depicted in FIG. 2.

Referring to FIG. 3, the driver 200 of the invention provides a temperature compensated and output adjustable alternating current signal to the ultraviolet lamp 120. The driver 200 is essentially a modified Baxandall oscillator wherein direct current is supplied from both a first variable voltage supply circuit $V_{in}$, and a second fixed voltage supply circuit $V_b$, characterized in that the direct current supplied by the first variable voltage supply circuit $V_{in}$ is not biased via a biasing resistor $R_b$ prior to reaching the pair of transistors $Q_1$ and $Q_2$ while the direct current supplied by the second fixed voltage supply circuit $V_b$ is biased through a series of a positive temperature coefficient resistor $R_t$ such as a positive temperature coefficient silicon resistor, and a primary bias resistor $R_b$ prior to reaching the transistors $Q_1$ and $Q_2$. As with the Baxandall oscillator, the driver 200 in accordance with the invention further includes an inductor L and a capacitor C as depicted in FIG. 3.

Configuration of the oscillator in accordance with the invention with the positive temperature coefficient resistor $R_t$ allows for constant bias to transistors $Q_1$ and $Q_2$ independent of the oscillator's variable input voltage $V_{in}$ and temperature changes. The resistance of $R_t$ will decrease at cold temperatures (when it needs to be low) and increase at hot temperatures (when it does not need to be low), thereby assuring a higher current under cold conditions to aid starting, without unnecessary power consumption at hot temperatures. $R_t$ and $R_b$ can be selected such that the oscillator easily starts at cold temperatures without undue power consumption at the higher temperatures. Low power consumption is an important benefit because most PID sensors are battery operated.

The photoionization detector sensor 100 equipped with a driver 200 in accordance with the invention is particularly adapted to detect and quantify the concentration of volatile organic compounds in a sample.

Factory Standardization

Output from a photoionization detector sensor 100 equipped with a driver 200 in accordance with the invention may be standardized so that reported values of target analyte A concentration in a target analyte A containing test sample will more closely approximate actual values of target analyte A concentration in the target analyte A containing test sample. The method involves the steps of (A) activating the photoionization detector sensor 100 to detect target analyte A in a standardizing sample to create an electrical signal $S_2$ having a test value, wherein the standardizing sample has a known concentration of the target analyte A and is expected to generate an electrical signal $S_2$ of known anticipated value, (B) comparing the test value and the anticipated value, and (C) standardizing output of the photoionization detector sensor 100 by adjusting the voltage supplied to the driver 200 by the first variable voltage supply circuit $V_{in}$ so that future reported values will more closely approximate actual values.

We claim:

1. A temperature compensating and output adjustable ultraviolet lamp driver for supplying an alternating current signal to the ultraviolet lamp effective to light the ultraviolet lamp, the driver comprising an oscillator driving a primary side of a transformer wherein the oscillator includes a pair of transistors configured to operate out-of-phase feeding the primary side of the transformer with (i) direct current from a first variable voltage supply circuit, and (ii) direct current from a second fixed voltage supply circuit, characterized in that the direct current from the second fixed voltage supply circuit is biased through a series of a positive temperature coefficient resistor and a primary bias resistor prior to reaching the transistors.

2. The temperature compensating and output adjustable ultraviolet lamp driver of claim 1 wherein out-of-phase operation of the pair of transistors is maintained via a feedback signal from the primary side of the transformer.

3. The temperature compensating and output adjustable ultraviolet lamp driver of claim 1 wherein the transformer is a step-up transformer.

4. The temperature compensating and output adjustable ultraviolet lamp driver of claim 1 wherein the oscillator is a modified Baxandall oscillator.

5. A photoionization detector sensor having (i) an ultraviolet lamp operable for ionizing a target analyte within a sample, (ii) ignition electrodes for generating target analyte ionizing ultraviolet radiation within the lamp, (iii) sensing electrodes for detecting the presence of ionized target analyte within the sample and generating a current signal proportional to the concentration of target analyte within the sample, and (iv) a driver in accordance with claim 1 in electrical communication with the ignition electrodes.

6. The photoionization detector sensor of claim 5 wherein the ultraviolet lamp is operable for ionizing a volatile organic compound target analyte.

7. A photoionization detector sensor having (i) a housing defining a sample retention chamber, (ii) an ultraviolet lamp operable for ionizing a target analyte within the sample retention chamber, (iii) ignition electrodes for generating target analyte ionizing ultraviolet radiation within the lamp, (iv) an anode-cathode pair for detecting the presence of ionized target analyte within the sample retention chamber and generating a current proportional to the concentration of target analyte within the sample retention chamber, and (v) a driver in accordance with claim 1 in electrical communication with the ignition electrodes.

8. The photoionization detector sensor of claim 7 wherein the ultraviolet lamp is operable for ionizing a volatile organic compound target analyte.

9. A method of standardizing output of a photoionization detector sensor in accordance with claim 5 so that reported values of target analyte concentration in a target analyte containing test sample will more closely approximate actual values of target analyte concentration in the target analyte containing test sample, comprising the steps of (A) activating the photoionization detector sensor to detect target analyte in a standardizing sample to create an electrical signal having a test value, wherein the standardizing sample has a known concentration of the target analyte and is expected to generate an electrical signal of known anticipated value, (B) comparing the test value and the anticipated value, and (C) standardizing output of the photoionization detector sensor by adjusting the voltage supplied to the driver by the first variable voltage supply circuit so that future reported values will more closely approximate actual values.

10. A method of standardizing output of a photoionization detector sensor in accordance with claim 7 so that reported values of target analyte concentration in a target analyte containing test sample will more closely approximate actual values of target analyte concentration in the target analyte containing test sample, comprising the steps of (A) activating the photoionization detector sensor to detect target analyte in a standardizing sample to create an electrical signal having a test value, wherein the standardizing sample has a known concentration of the target analyte and is expected to generate an electrical signal of known anticipated value, (B) comparing the test value and the anticipated value, and (C) standardizing output of the photoionization detector sensor by adjusting the voltage supplied to the driver by the first variable voltage supply circuit so that future reported values will more closely approximate actual values.

\* \* \* \* \*